United States Patent [19]

Samukawa

[11] Patent Number: 5,366,586
[45] Date of Patent: Nov. 22, 1994

[54] PLASMA FORMATION USING ELECTRON CYCLOTRON RESONANCE AND METHOD FOR PROCESSING SUBSTRATE BY USING THE SAME

[75] Inventor: Seiji Samukawa, Tokyo, Japan
[73] Assignee: NEC Corporation, Tokyo, Japan
[21] Appl. No.: 12,933
[22] Filed: Feb. 3, 1993

[30] Foreign Application Priority Data

Feb. 3, 1992 [JP] Japan .................. 4-17396
Feb. 18, 1992 [JP] Japan .................. 4-29820

[51] Int. Cl.⁵ .............................. H01L 21/00
[52] U.S. Cl. .................. 156/643; 156/345; 118/723 MW; 118/723 MA; 118/723 MR; 427/526
[58] Field of Search ............. 156/643, 345; 118/723 MW, 723 MA, 723 ME, 723 MR; 427/569

[56] References Cited

U.S. PATENT DOCUMENTS 4,876,983 10/1989 Fukuda et al. ............. 118/722
5,013,401 5/1991 Samukawa et al. ......... 156/643

FOREIGN PATENT DOCUMENTS

56-155535 12/1981 Japan.
60-134423 7/1985 Japan.
3-040422 2/1991 Japan.
4-343420 11/1992 Japan.

*Primary Examiner*—Olik Chaudhuri
*Assistant Examiner*—George Goudreau

[57] ABSTRACT

In the ECR plasma generating method, the microwave introduced into the plasma formation chamber is oscillated at frequencies in the range of a predetermined bandwidth, and the magnetic field applied to the introduced microwave has the flux densities in the range corresponding to the frequency bandwidth so as to meet the ECR condition, resulting a high density ECR plasma. The frequency bandwidth is at least +−4% of the center frequency of 2.45 GHz. The gradient of the magnetic field at the ECR area is at most 10 Gauss/cm. When a substrate is processed by the plasma generated by using the ECR, the ECR area is formed at a position at least 5 cms away from the microwave introducing window.

18 Claims, 7 Drawing Sheets

PLASMA FORMATION USING ELECTRON CYCLOTRON RESONANCE AND METHOD FOR PROCESSING SUBSTRATE BY USING THE SAME

FIELD OF THE INVENTION

The present invention relates to plasma formation and a method of processing a substrate by using the plasma and, in particular, to plasma formation using electron cyclotron resonance (hereinafter referred to as ECR) and a method of processing a substrate such that a deposit film is formed on the substrate, or the surface of the substrate is dry etched by using the plasma.

BACKGROUND OF THE INVENTION

ECR plasma CVD (chemical vapor deposition) which forms a deposit film on a substrate by utilizing the ECR plasma reaction has an advantage such that it allows a low-temperature formation of the film and gives a less damage to the substrate. Further, the ECR plasma etching has some features that the exposure damage is small, the etching selection ratio is high and the anisotropic etching is possible, and forms one of the important etching methods in carrying out a highly fine processing on the substrate.

Figure 1:
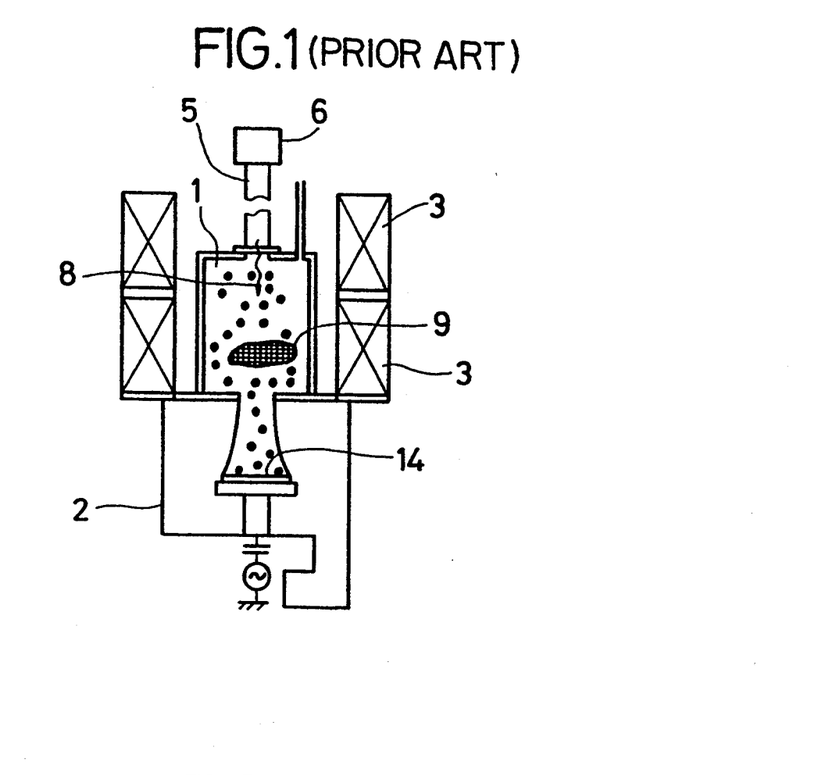
FIG. 1 is a schematic view of the arrangement of a conventional ECR plasma etching apparatus.
Figure 2:
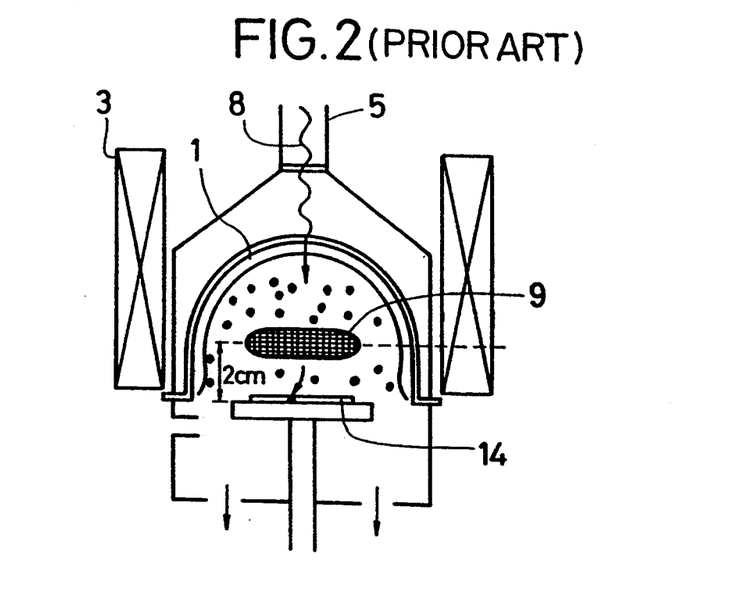
FIG. 2 is a schematic view of the arrangement of a conventional ECR plasma film depositing apparatus.

As the apparatus for etching or formation of a deposit film by utilizing the ECR, two typical examples have conventionally been known. FIG. 1 illustrates a first example, and FIG. 2 illustrates a second example. According to the apparatus of FIG. 1, a $TE_{11}$ mode microwave 8 is introduced into a plasma formation chamber 1 from a magnetron 6 through a waveguide 5, and an ECR area 9 is formed by the interaction between the microwave 8 and the magnetic field generated by a coil 3. A reactive gas plasma formed by this ECR is conveyed through a plasma stream into the etching chamber 2 by the divergent magnetic field caused by the coil 3, where a substrate 14 is etched by ion impact. (See Japanese Patent Laid-Open No. 56-155535.)

According to the apparatus of FIG. 2, within the plasma formation chamber 1, the substrate 14 is disposed remote from the ECR area 9 by a predetermined distance. In this arrangement, a local separation of electrons and ions takes place within the reactive gas plasma prevailing within the plasma formation chamber 1, and a resulting static electric field causes the ions to be withdrawn from the gas and to be exposed onto the substrate 14 for process such as formation of the deposit film or the like. (See Japanese Patent Laid-Open No. 60-134423.)

Figure 3:
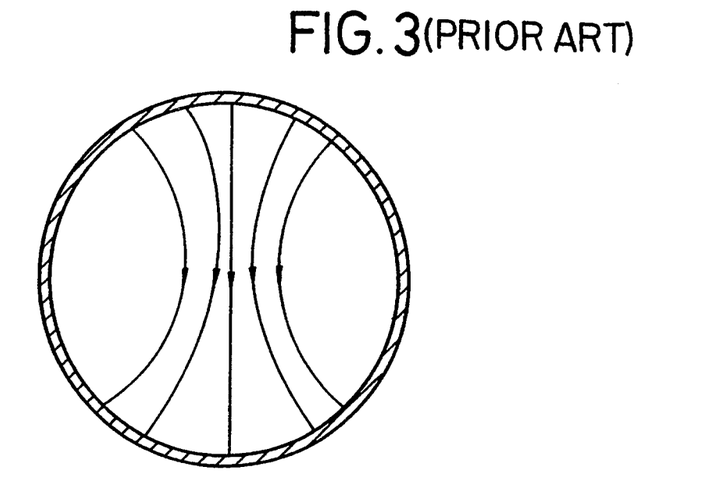
FIG. 3 is a view of the distribution of the microwave electric field prevailing within a circular waveguide.

Each of the two apparatus is designed to form the ECR area 9 within 5 cms (centimeters) from the microwave introducing window of the plasma formation chamber 1. Further, since there exists the electric field intensity distribution of the $TE_{11}$ mode microwave 8 in the waveguide 5 as shown in FIG. 3, an unevenness takes place in the density distribution of the plasma generated in the chamber 1. In order to avoid the undesired effect of the uneven density distribution of the plasma, the substrate 14 is disposed at a sufficient distance from the ECR area 9.

Figure 4:
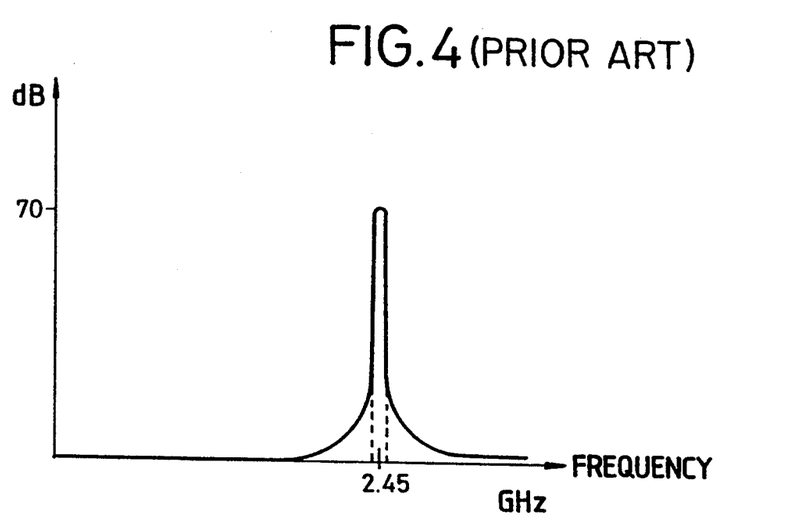
FIG. 4 is a graph of the frequency bandwidth of the microwave according to the conventional embodiment.
Figure 5:
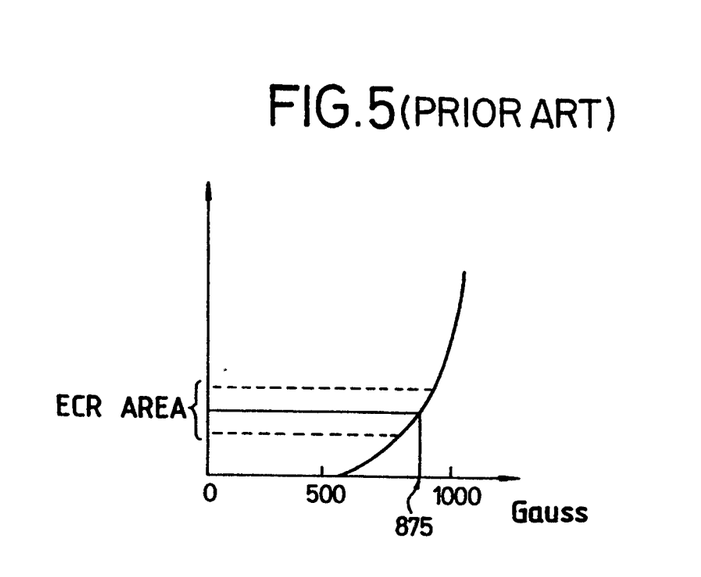
FIG. 5 is a graph of the magnetic field gradient according to the conventional embodiment.

Further, as shown in FIG. 4, the center frequency of the microwave 8 equals 2.45 GHz, and its frequency bandwidth is in the range of 2.45 GHz $+-1$ MHz. Further, the magnetic field applied to the microwave 8 by the coil 3 has a gradient of the flux density as shown in FIG. 5. In the apparatus of FIG. 2, the magnetic field gradient equals about 40 Gauss/cm in the ECR area 9 which is formed 2 cms above the substrate 14.

However, in the two apparatus, in order to obtain an uniform plasma density distribution on the substrate 14, the substrate 14 is disposed at a sufficient distance from the ECR area 9. As a result, the plasma density becomes low, and practical speeds of process such as the film deposition and the etching cannot be obtained.

Further, since the bandwidth of the introduced microwave is very narrow such as $+-1$ MHz, the microwave absorbing efficiency is low, and a high density plasma cannot be obtained. In consequence, the ion current becomes low, and the practical processing speeds cannot be achieved.

Accordingly, an object of the present invention is to provide a method of generating a higher density plasma so that the processing speed of the substrate is improved by increasing the ion current.

Another object of the present invention is to provide a method of achieving the uniform density distribution of the plasma generated at the ECR area to allow the substrate processing such as etching or deposit film formation in the vicinity of the ECR area.

SUMMARY OF THE INVENTION

According to the ECR plasma generating method of the present invention, the microwave introduced into the plasma formation chamber is oscillated at frequencies in the range of a predetermined bandwidth, and the magnetic field applied to the introduced microwave is set to flux densities in the range corresponding to the frequency bandwidth to generate a high density ECR plasma. In a preferred embodiment, the microwave has the frequency bandwidth equal to or greater than $+-4\%$ of the center frequency of 2.45 GHz. Corresponding to the frequency bandwidth of the microwave, the magnetic flux density is determined by the formula: $B=2\pi m/e \cdot f$, where B denotes a magnetic flux density (in Gauss) at the ECR area, m the mass of an electron, e the electric change of an electron, and f a microwave frequency. More preferably, the magnitude of the gradient of the magnetic field at the ECR area is equal to or lower than 10 Gauss/cm.

According to the substrate processing method of the present invention, the ECR area is formed at a place substantially 5 cms away from the window for introducing the microwave into the plasma formation chamber, resulting a substantially uniform density distribution of the ECR plasma generated therein.

DETAILED DESCRIPTION OF THE PREFERRED EMBODIMENTS

Figure 6:
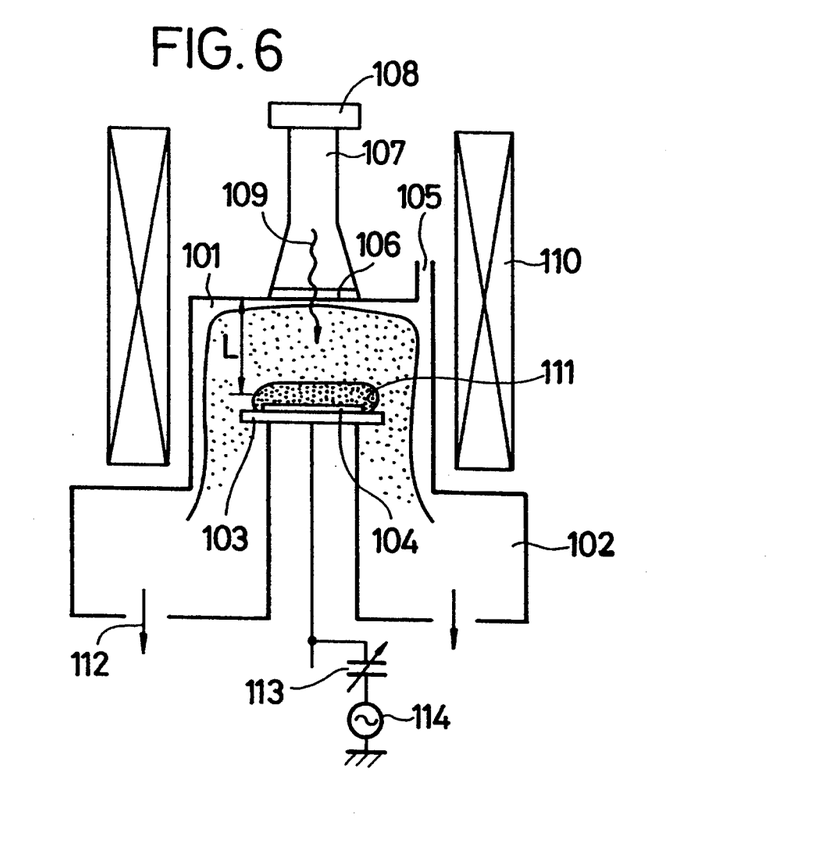
FIG. 6 is a schematic view of the arrangement of an ECR plasma processing apparatus for carrying out an embodiment of the present invention.

Referring to FIG. 6, the present apparatus is comprised of a plasma formation chamber 101 and a substrate transfer chamber 102. A substrate holder 103 is provided at a predetermined position within the plasma formation chamber 101. A substrate 104 to be processed is conveyed within the substrate transfer chamber 102 to be placed and held on the substrate holder 103 by means of a robot arm (not shown).

The plasma formation chamber 101 is provided with a gas introducing system 105 for introducing gas for use of generating plasma and a microwave introducing window 106 comprising an insulation plate made of, for example, a quartz glass, ceramic or the like. The microwave introducing window 106 is connected to a microwave power supply 108 via a waveguide 107, and a $TE_{11}$ mode microwave 109 is introduced into the plasma formation chamber 101 through the microwave introducing window 106.

Along the outer circumference of the plasma formation chamber 101, an air-core solenoid coil 110 is provided, which generates a magnetic field in the direction perpendicular to the electric field of the microwave introduced into the plasma formation chamber 101. The interaction between the two fields forms the ECR area 111 at a predetermined position lying at a distance L from the microwave introducing window 106. The ECR causes the gas plasma to be generated within the plasma formation chamber 101, and the substrate 104 is exposed to the resulting ions therein for etching its surface or depositing a film on it.

Incidentally, an exhaust system 112 exhausts the plasma generation chamber 101 and the substrate transfer chamber 102 to a predetermined degree of vacuum (for example, about $5 \times 10^{-4}$ Torr). In addition, the substrate holder 103 is connected to a capacitor 113 which in turn is connected to a radio frequency bias power supply 114.

Plasma Formation

A specific embodiment of the plasma generating method according to the present invention is described with reference to the apparatus mentioned above.

Figure 7:
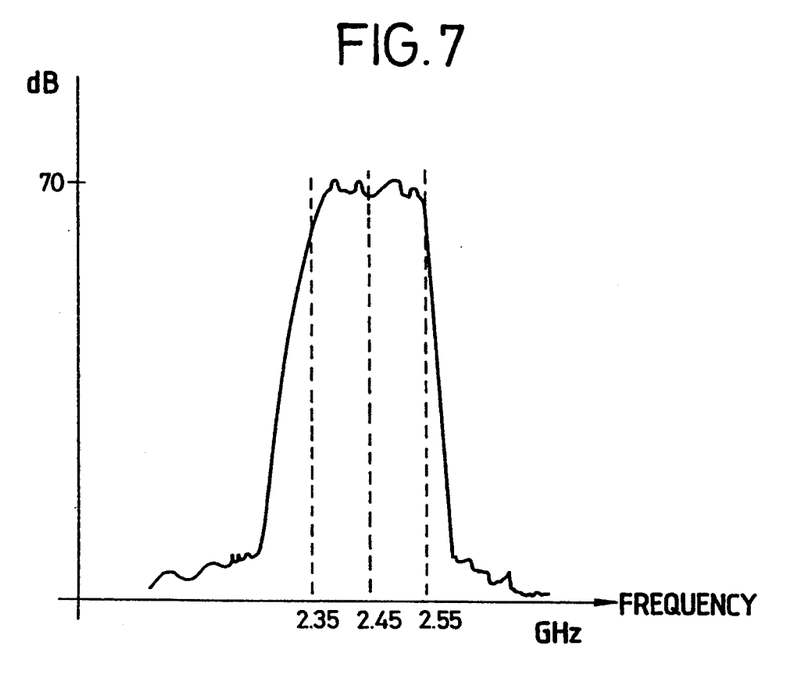
FIG. 7 is a graph of a microwave bandwidth for explaining a specific embodiment of the plasma generating method according to the present invention.

It has been found that an ECR plasma of sufficient high density could not be obtained by the prior art because of using the microwave of narrow bandwidth of $+-1$ MHz. Therefore, as illustrated in FIG. 7, the microwave 109 oscillated in the embodiment includes frequencies in the range of a bandwidth of $+-100$ MHz of the center frequency of 2.45 GHz, and is introduced into the plasma generation chamber 101. At this time, the magnetic field applied to the microwave 109 by the coil 110 is set to the range corresponding to the frequency bandwidth of the microwave 109. That is, the applied magnetic field is set to meet the ECR condition by using the following formula: B 32 $2\pi m/e \cdot f$. Here, B denotes a magnetic flux density (in Gauss) at the ECR area 111, m the mass of an electron, e the electric charge of an electron, and f a microwave frequency.

In this embodiment, since the microwave 109 has a frequency bandwidth as shown in FIG. 7, the applied flux density B at the ECR area 111 is defined to the range of approximately 840 to 910 Gauss. Since the frequency bandwidth of the microwave 109 and the range of the applied magnetic field were set as described above, the ECR area 111 was enlarged as compared with the conventional arrangements, and the higher density plasma was generated, in other words, the ion current density was increased.

Figure 8:
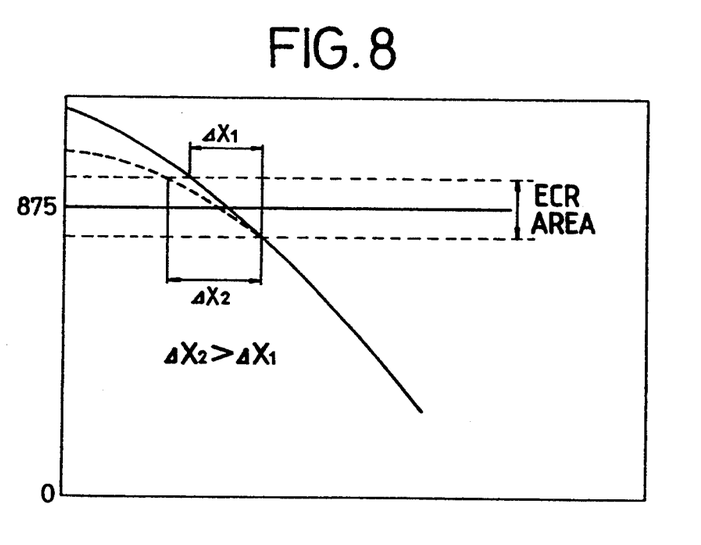
FIG. 8 is a graph for explaining the embodiment, representing a relationship between the distance from the microwave introducing window and the intensity of the magnetic field.

We attempted an experiment to further increase the ion current density. As seen from the graph of FIG. 8, the magnitude of the flux density becomes low as the distance from the microwave introducing window 106 is increased. From this experimental result, it was found that, when the magnetic field gradient was made smaller in the vicinity of 875 Gauss where the ECR takes place, the size of the ECR area was further increased. That is, in FIG. 8, $X_2 > X_1$. This means the improved microwave absorption efficiency which makes the resulting plasma density increased.

Figure 9:
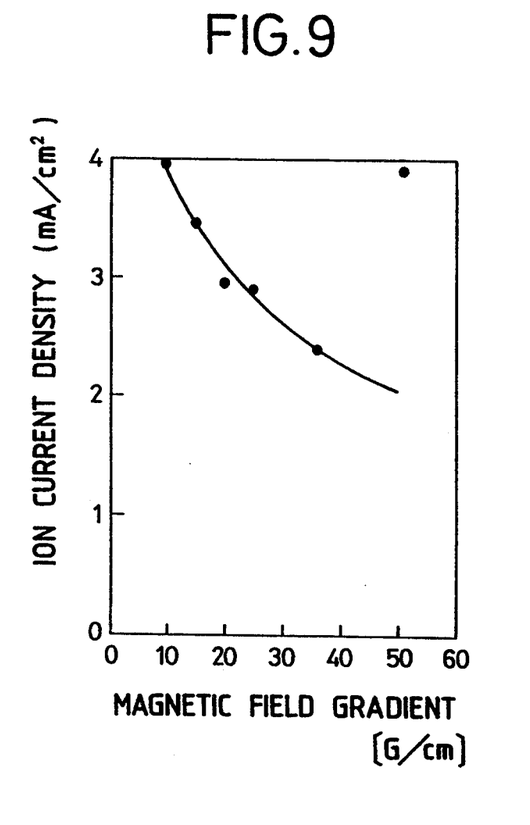
FIG. 9 is a graph of a relationship between the magnetic field gradient and the ion current density.

From this discovery, we carried out an experiment to evaluate the relationship between the gradient of the magnetic field generated by the coil 110 and the ion current density generated by the ECR plasma under the introduced microwave having the bandwidth as shown in FIG. 7. Its result is shown in FIG. 9. As seen from this graph, the smaller the gradient of the magnetic field, the greater the ion current density. In particular, when the gradient of the magnetic field falls to 10 Gauss/cm and below, a higher density plasma is generated, in other words, a higher ion current density can be obtained.

The following conclusion was obtained from the above-mentioned experiment. When the microwave 109 introduced into the plasma generation chamber 101 has the bandwidth equal to or more broad than, for example, $+-4\%$ of the center frequency and the magnetic field applied to the microwave 109 has the range of flux density corresponding to that microwave bandwidth so as to meet the ECR condition, the high density plasma can be generated with the result that a high density ion current can be obtained. Further, if the gradient of the magnetic field is set to 10 Gauss/cm and below, a further high density of the ion current can be obtained. By increasing the ion current density as described above, it is possible to further improve the processing speed such as of forming the deposit film or etching using the ECR plasma.

Uniformization of Distribution of the Plasma Density

Figure 10:
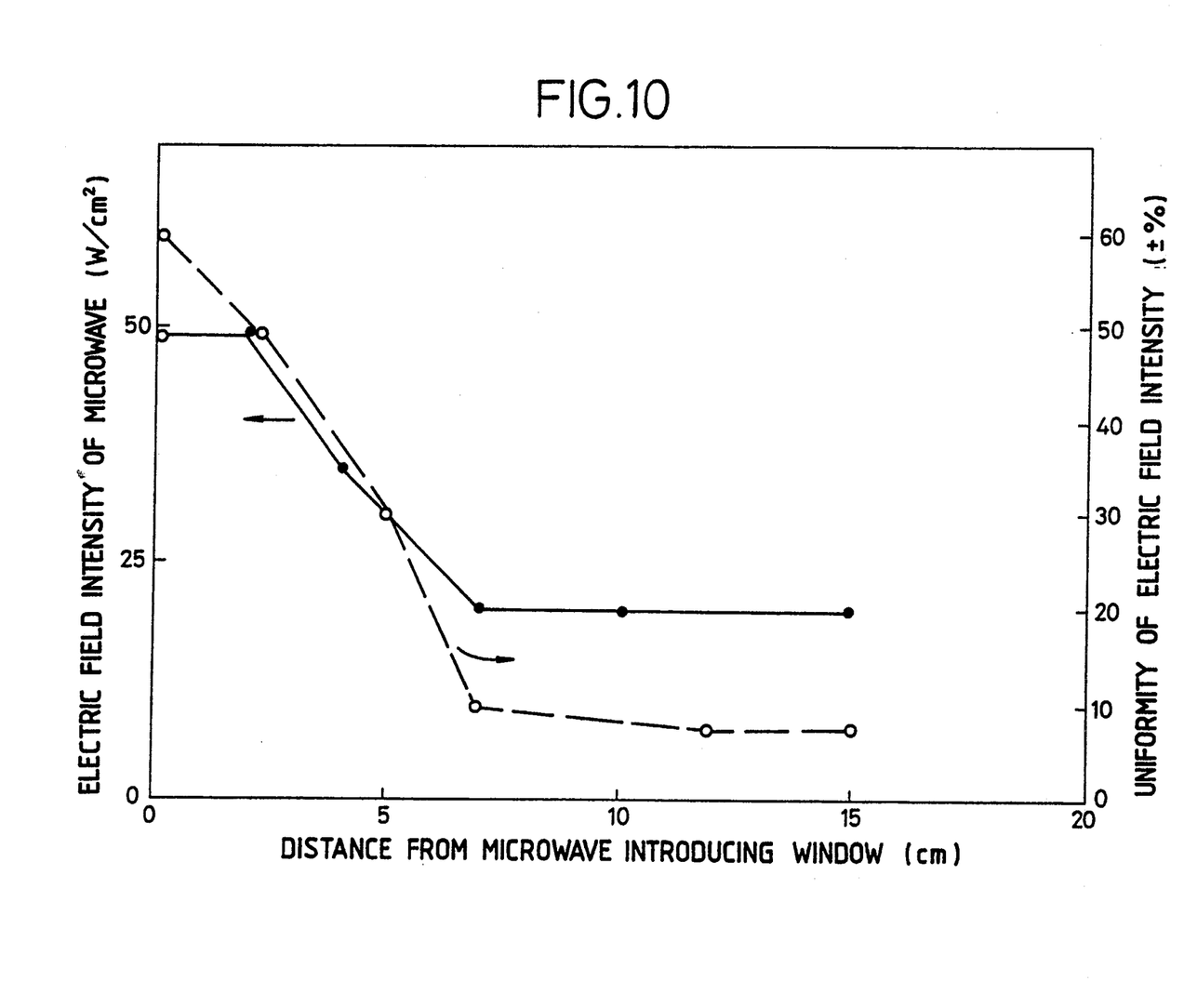
FIG. 10 is a graph of the microwave electric field intensity and its uniformity depending on a distance between the microwave introducing window and the ECR area.

It has been found that the microwave 109 introduced into the plasma formation chamber 101 through the microwave introducing window 106 is not uniform reflecting the distribution of the electric field intensity of the waveguide 107. FIG. 10 illustrates a graph of the electric field intensity (indicated by a solid line) of the introduced microwave relative to the distance from the microwave introducing window 106 and its uniformity (indicated by a broken line). It should be noted that on the right longitudinal axis of the graph representing the uniformity $(+-\%)$ of the electric field intensity, the higher its percentage is, the higher the unevenness of the electric field intensity is.

As seen from this graph, the closer the microwave is to the introducing window 106, the higher its electric field intensity is, but its distribution is in less uniformity. Therefore, if the ECR area is formed near the microwave introducing window as in the prior art, then the density distribution of the plasma also becomes uneven and, in order to suppress that effect, it has been necessary to place the substrate at a position sufficiently away from the ECR area.

By contrast, if the ECR area 111 is formed at a distance of 5 cms and above from the microwave introducing window 106, then, as seen from FIG. 10, the intensity distribution of the electric field turns out to be in a sufficient uniformity from the practical point of view although the intensity is slightly reduced.

Figure 11:
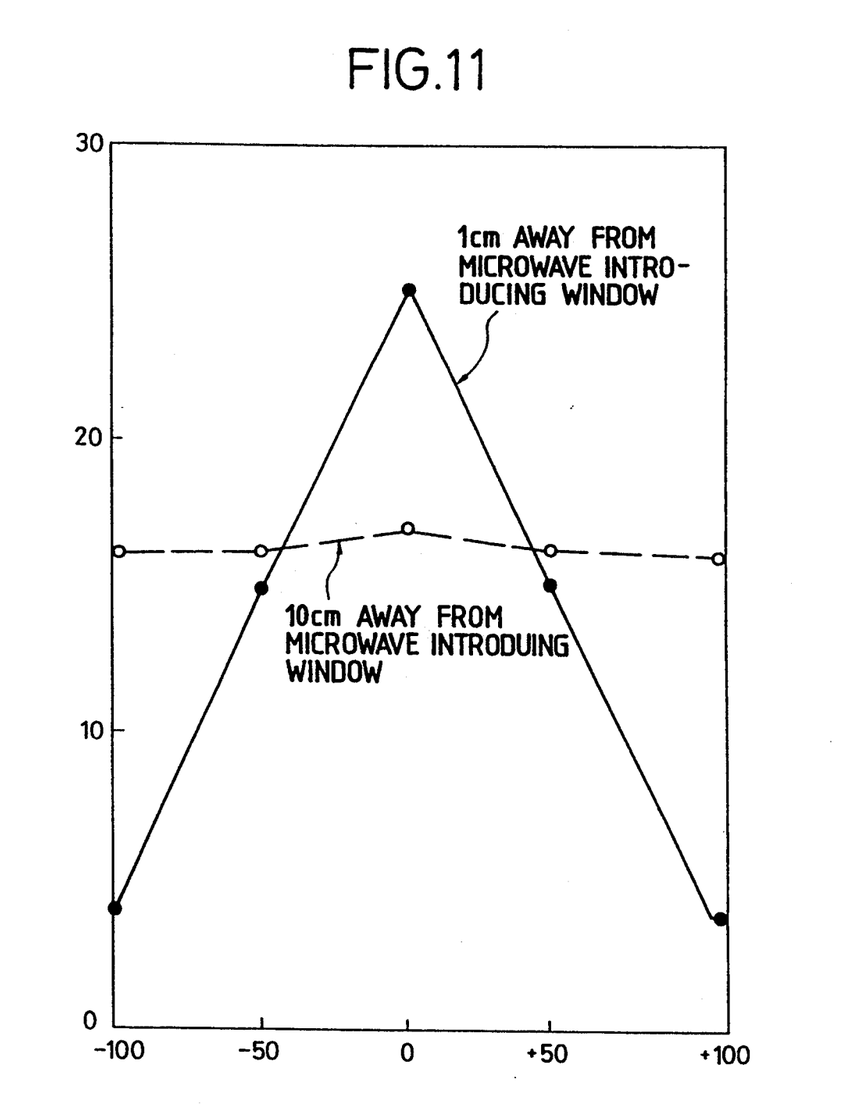
FIG. 11 is a graph of the uniformity of the formed plasma depending on the distance between the microwave introducing window and the ECR area.

Since the electric field intensity of the microwave becomes sufficiently even, it becomes possible to generate a plasma with an uniformized density distribution. This result is shown in FIG. 11 where the plasma density distribution is represented in terms of the ion current density distribution. It is found that the plasma density distribution (indicated by broken line) at the position 10 cms away from the microwave introducing window 106 is substantially even as compared with that (indicated by solid line) at a position 1 cm away from the window 106.

In the apparatus of FIG. 6, it is arranged so that the distance L from the microwave introducing window 106 to the ECR area 111 is not less than 5 cms. Thus, the electric field distribution of the introduced microwave becomes sufficiently even at the ECR area 111, and the density distribution of the generated plasma also becomes even. In consequence, it is possible to place the substrate in the neighborhood of the ECR area 111 for formation of a thin film and etching of the surface of the substrate with practical characteristics.

What is claimed is:

1. Method for generating plasma by utilizing electron cyclotron resonance, comprising the steps of:
    introducing a microwave having a frequency bandwidth into a plasma formation chamber, said frequency bandwidth having a range of at least $+/-4\%$ of a center frequency for increasing absorbing efficiency of the microwave to produce a high density plasma; and
    applying a magnetic field to said microwave in a direction perpendicular to an electric field of said microwave, said magnetic field having a flux density range dependent upon the range of said frequency bandwidth of said microwave so as to meet a condition of electron cyclotron resonance.

2. Method as set forth in claim 1 wherein a magnitude of a gradient of said magnetic field in the direction in which said microwave is introduced is at most 10 Gauss/cm in an electron cyclotron resonance area.

3. Method as set forth in claim 1 wherein said center frequency equals 2.45 GHz.

4. Method as set forth in claim 1 wherein said flux density is determined by $B=2\pi m/e \cdot f$, where B denotes a magnetic flux density (in Gauss) at an electron cyclotron resonance area, m denotes mass of an electron, e denotes electric charge of an electron, and f denotes a microwave frequency.

5. Method for etching the surface of a substrate by setting an introduced gas in plasma utilizing electron cyclotron resonance, comprising the steps of:
    introducing a microwave having a frequency bandwidth into a plasma formation chamber, said frequency bandwidth having a range of at least $+/-4\%$ of a center frequency for increasing absorbing efficiency of the microwave to produce a high density plasma; and
    applying a magnetic field to said microwave in a direction perpendicular to an electric field of said microwave, said magnetic field having a flux density range dependent upon the range of said frequency bandwidth of said microwave so as to meet a condition of electron cyclotron resonance.

6. Method as set forth in claim 5 wherein said center frequency equals 2.45 GHz.

7. Method as set forth in claim 5 wherein said flux density is determined by $B=2\pi m/e \cdot f$, where B denotes a magnetic flux density (in Gauss) at an electron cyclotron resonance area, m denotes mass of an electron, e denotes electric charge of an electron, and f denotes a microwave frequency.

8. Method as set forth in claim 5 wherein a magnitude of a gradient of said magnetic field in the direction in which said microwave is introduced is at most 10 Gauss/cm in an electron cyclotron resonance area.

9. Method of processing a substrate by setting an introduced gas in plasma utilizing electron cyclotron resonance, comprising the steps of:
    introducing a microwave through a microwave introducing window into a plasma formation chamber;
    applying a magnetic field meeting a condition of electron cyclotron resonance in a direction perpendicular to an electric field of said microwave; and
    forming an electron cyclotron resonance area at a stationary position at least 5 cms away from said microwave introducing window and within said plasma formation chamber.

10. Method of etching a substrate by setting an introduced gas in plasma utilizing electron cyclotron resonance, comprising the steps of:
    introducing a microwave through a microwave introducing window into a plasma formation chamber;
    applying a magnetic field meeting a condition of electron cyclotron resonance in a direction perpendicular to an electric field of said microwave; and
    forming an electron cyclotron resonance area at a position at least 5 cms away from said microwave introducing window and within said plasma formation chamber.

11. Method of processing a substrate by setting an introduced gas in plasma utilizing electron cyclotron resonance, comprising the steps of:
    introducing a microwave, said microwave having a frequency bandwidth, through a microwave introducing window and into a plasma formation chamber, said frequency bandwidth having a range of at least $+/-4\%$ of a center frequency for increasing absorbing efficiency of the microwave to produce a high density plasma;
    applying a magnetic field to said microwave in a direction perpendicular to an electric field of said microwave, said magnetic field having a flux density range dependent upon the range of said frequency bandwidth of said microwave so as to meet a condition of electron cyclotron resonance; and
    forming an electron cyclotron resonance area at a position at least 5 cms away from said microwave introducing window and within said plasma formation chamber.

12. Method as set forth in claim 11 wherein said flux density is determined by $B=2\pi m/e \cdot f$, where B denotes a magnetic flux density (in Gauss) at the electron cyclotron resonance area, m denotes mass of an electron, e denotes electric charge of an electron, and f denotes a microwave frequency.

13. Method as set forth in claim 11 wherein a magnitude of a gradient of said magnetic field in the direction in which said microwave is introduced is at most 10 Gauss/cm in said electron cyclotron resonance area.

14. Method of etching a substrate by setting an introduced gas in plasma utilizing electron cyclotron resonance, comprising the steps of:

introducing a microwave, said microwave having a frequency bandwidth, through a microwave introducing window and into a plasma formation chamber, said frequency bandwidth having a range of at least $+/-4\%$ of a center frequency for increasing absorbing efficiency of the microwave to produce a high density plasma;

applying a magnetic field to said microwave in a direction perpendicular to an electric field of said microwave, said magnetic field having a flux density range dependent upon the range of said frequency bandwidth of said microwave so as to meet a condition of electron cyclotron resonance; and forming an electron cyclotron resonance area at a position at least 5 cms away from said microwave introducing window and within said plasma formation chamber.

15. Method as set forth in claim 14 wherein said center frequency equals 2.45 GHz.

16. Method as set forth in claim 14 wherein said flux density is determined by $B=2\pi m/e \cdot f$, where B denotes a magnetic flux density (in Gauss) at the electron cyclotron resonance area, m denotes mass of an electron, e denotes electric charge of an electron, and f denotes a microwave frequency.

17. Method as set forth in claim 14 wherein a magnitude of a gradient of said magnetic field in the direction in which said microwave is introduced is at most 10 Gauss/cm in said electron cyclotron resonance area.

18. Method as set forth in claim 11 wherein said center frequency equals 2.45 GHz.

* * * * *